United States Patent
Starnes et al.

[11] Patent Number: 6,157,583
[45] Date of Patent: Dec. 5, 2000

[54] INTEGRATED CIRCUIT MEMORY HAVING A FUSE DETECT CIRCUIT AND METHOD THEREFOR

[75] Inventors: Glenn E. Starnes; Stephen T. Flannagan; Ray Chang, all of Austin, Tex.

[73] Assignee: Motorola, Inc., Schaumburg, Ill.

[21] Appl. No.: 09/261,876

[22] Filed: Mar. 2, 1999

[51] Int. Cl.[7] .................................................. G11C 7/00
[52] U.S. Cl. ...................................... 365/200; 365/225.7
[58] Field of Search .............................. 365/200, 225.7, 365/230.08, 240, 96, 230.06; 327/526

[56] References Cited

U.S. PATENT DOCUMENTS

| | | | |
|---|---|---|---|
| 4,446,534 | 5/1984 | Smith | 365/96 |
| 5,345,100 | 9/1994 | Renfro | 307/272.3 |
| 5,723,999 | 3/1998 | Merritt | 327/526 |
| 5,859,801 | 1/1999 | Poechmueller | 365/200 |

*Primary Examiner*—David Nelms
*Assistant Examiner*—David Lam
*Attorney, Agent, or Firm*—Lee E. Chastain; Daniel D. Hill

[57] ABSTRACT

Fuses and detect circuits (124) in an integrated circuit memory (100) include a copper fuse (208) and a fuse state detect stage (202) for detecting the open circuit state or the closed circuit state of the fuse (208). The fuse detect circuit (124) provides an output signal corresponding to the state of the fuse and during detecting, limits a voltage drop across the fuse to an absolute value independent of a power supply voltage applied to the integrated circuit memory. The fuse detect circuit (124) operates at power up of the integrated circuit memory (100) and is disabled after the state of the fuse is detected and latched, and the power supply is sufficient for reliable operation of the integrated circuit memory (100). By limiting the voltage drop across a blown copper fuse (208), a potential electro-migration problem is reduced.

20 Claims, 3 Drawing Sheets

INTEGRATED CIRCUIT MEMORY HAVING A FUSE DETECT CIRCUIT AND METHOD THEREFOR

FIELD OF THE INVENTION

This invention relates generally to integrated circuit memories and more particularly to an integrated circuit memory having a fuse detect circuit and method therefor.

BACKGROUND OF THE INVENTION

For many years fuses have been used in semiconductor circuits for a variety of purposes. For example, memory circuits typically use fuses to implement memory redundancy. Row and column redundancy hardware exists to replace inoperable bit cells or word lines at manufacturing test. The effect of using memory redundancy is to increase yield. The improvement in yield is accomplished by using redundant elements to replace defective elements of the memory array. The fuses are used as non-volatile memory to store redundancy related information.

Another common use of fuse technology in semiconductors is to implement electronic chip identification. Chip identification is accomplished by uniquely identifying the source of each chip including a lot, a wafer, and an X/Y coordinate location on a wafer so that a manufacturer can easily retrieve and report process data for a given integrated circuit. Fuses are used to accomplish this purpose in the same manner as fuses are used in memory redundancy. For example, identification fuses may be implemented in banks of fuses on an integrated circuit. To identify a particular integrated circuit a unique pattern of fuses is left closed and other fuses are made open. Such an identifying pattern of open and closed or conductive fuses creates a fingerprint or identifier for the integrated circuit. Upon assertion of a control signal, the conductivity of such fuses may be readily read out of the integrated circuit and stored in a scanned chain. The scanned information may then be read using any conventional scan test equipment.

Fuses have commonly been implemented in semiconductors with either polysilicon or metal. Metals which have been used in the past include aluminum and tungsten. Regardless of the material used to implement the fuse, programming circuitry is required in order to control whether or not the fuse has been blown and to indicate the status of the fuses conductivity. Such an example of a fuse circuit which is programmable is taught by Frederick Smith in U.S. Pat. No. 4,446,534 entitled "Programmable Fuse Circuit". Semiconductor fuses are typically made non-conductive, or blown, either by application of a large voltage (relative to power supply voltage magnitude) or by use of laser light. A blown fuse is essentially an open circuit and an intact fuse is a short circuit. In either event, a circuit is required to indicate the existing status of whether or not the fuse has successfully been made non-conductive. In such circuits it is common to permit a voltage differential to exist between the two terminals of the non-conductive fuse after the fuse has been blown or made non-conductive. The output of the fuse circuit will indicate whether or not the programming operation to blow a fuse was successful.

It has been recently discovered that copper can be used as conductors on integrated circuits, and as such, can also be used as fuses. However, there is a problem with using copper fuses in circuits that allow a voltage drop to be present across a blown fuse. Over time, common phenomenon such as electro-migration or dielectric breakdown may cause a conductive path to be reformed across a blown copper fuse that has a voltage drop across it. Therefore, a need exists for a circuit to detect whether or not a copper fuse is blown without causing a voltage drop across the fuse that is high enough to cause electro-migration or a dielectric breakdown.

DETAILED DESCRIPTION OF THE DRAWINGS

Figure 1:
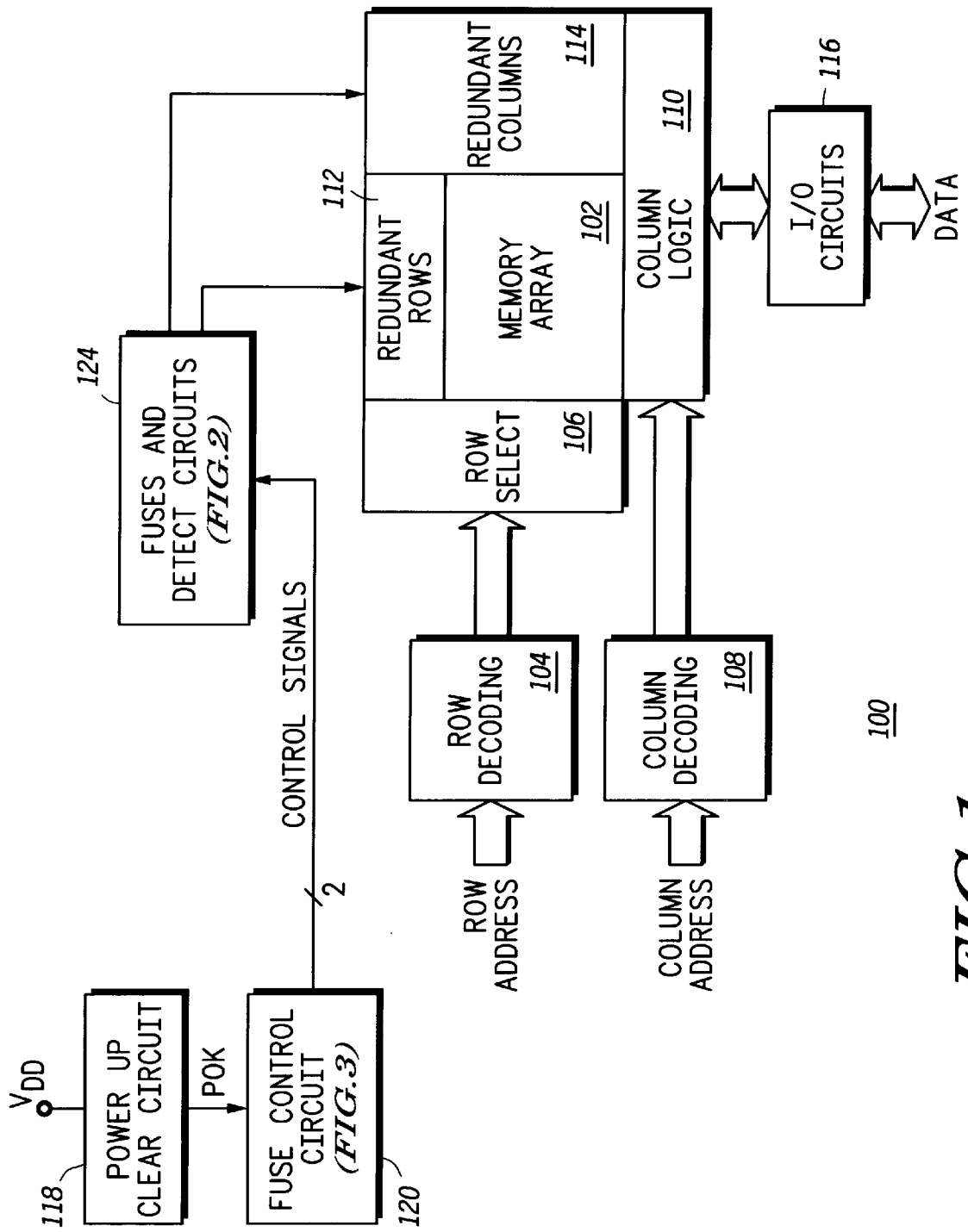
FIG. 1 depicts a block diagram of a memory having fuses and detect circuits in accordance with the present invention.

FIG. 1 depicts a block diagram of a memory 100 having fuses and detect circuits 124 in accordance with the present invention. Fuses and detect circuits 124 detect the logic states of redundancy fuses (See FIG. 2) upon the application of power to memory 100. These redundancy fuses may be used to indicate inoperable rows or columns within memory 100, may be used to otherwise adjust the operation of memory 100, may be used to identify memory 100, etc. Fuses and detect circuits 124 are able to sense stored logic states by applying a very low voltage to the fuses for a short duration of time. This sensing strategy has several advantages. First, the combination of low voltage and short duration reduces the likelihood of an open or "blown" fuse from regrowing to a closed state. This phenomenon is especially important if the fuses are manufactured using a copper process. Second, the short duration of time reduces the power consumed by fuses and detect circuits 124. Power consumption affects a variety of parameters, including portability, heat dissipation, and reliability.

Returning to FIG. 1, memory 100 contains a memory array 102. Memory array 102 comprises an N×M matrix of bit cells, each able to store a single bit of information. A specific bit within memory array 102 is specified by a particular address. A first portion of the address, a ROW ADDRESS, is input to a row decoding circuit 104. Row decoding circuit 104 partially decodes the ROW ADDRESS to select a single row within memory array 102. The output of row decoding circuit 104 is input to a row select circuit 106 which generates a final one-of-N decoding. Similarly, a second portion of the address, a COLUMN ADDRESS, is input to a column decoding circuit 108. Column decoding circuit 108 partially decodes the COLUMN ADDRESS to select a column within memory array 102. The output of column decoding circuit 108 is input to a column select circuit 110 which generates a final one-of-M decoding. The data bit identified by the input address, DATA, is output through or input from input/out (I/O) circuits 116.

Memory 100 also contains a set of redundant rows 112 and a set of redundant columns 114. As known in the art, the use of redundant columns and redundant rows improves the manufacturing yield of memory 100. One of redundant rows 112 is selected by the output of fuses and detect circuits 124. Fuses and detect circuits 124 enable one of redundant rows 112 when an input row matches a row previously identified as faulty. Similarly, one of redundant columns 114 is selected by the output of fuses and detect circuits 124. Fuses and detect circuits 124 enable one of redundant columns 114 when an input column matches a column previously identified as faulty. Fuses and detect circuits 124 are described below in connection with FIG. 2.

Finally, a power up clear circuit 118 receives a voltage supply VDD and generates a control signal POK. A fuse control circuit 120 receives the control signal POK and generates two control signals, LATCH and DRIVE. Fuse control circuit 120 is described below in connection with FIG. 3. LATCH and DRIVE are input to fuses and detect circuits 124.

The operation of memory 100 may be conveniently described with reference to a power on sequence mode and a normal operating mode. However, prior to either mode of operation, memory 100 will be inspected after manufacture to determine if any columns or rows are faulty. If memory 100 contains faulty columns or rows, then the manufacturer will blow one or more fuses within fuses and detect circuits 124. In one embodiment of the present invention, copper fuses are blown by the selective application of a laser beam. These fuses identify the failing rows and/or columns when memory 100 is used later. If no columns or rows are faulty, then no fuses need to be blown.

During the power on sequence mode, fuses and detect circuits 124 sense the logic states of the various redundancy fuses. After a short delay, power up clear circuit 118 will determine that enough time has elapsed for this sensing and will asset POK. Fuse control circuit 120, receiving POK, forces fuses and detect circuits 124 to save the various logic states by asserting the control signal LATCH. Immediately afterwards, fuse control circuit 120 disables the sensing function of fuses and detect circuits 124 by de-asserting the control signal DRIVE.

During the normal operating mode, data is either read from or written to a particular memory cell identified by the intersection of row and column address. If the input row address matches a row address stored in fuse and detect circuits 124, then I/O circuit 116 will output the data stored at the intersection of a redundant row and the selected column. Similarly, if the input column address matches a column address stored in fuse and detect circuits 124, then I/O circuit 116 will output the data stored at the intersection of a redundant column and the selected row. Finally, if both the input row address and the input column address match addresses stored in fuse and detect circuits 124, then I/O circuit 116 will output the data stored at the intersection of a redundant row and a redundant column.

Figure 2:
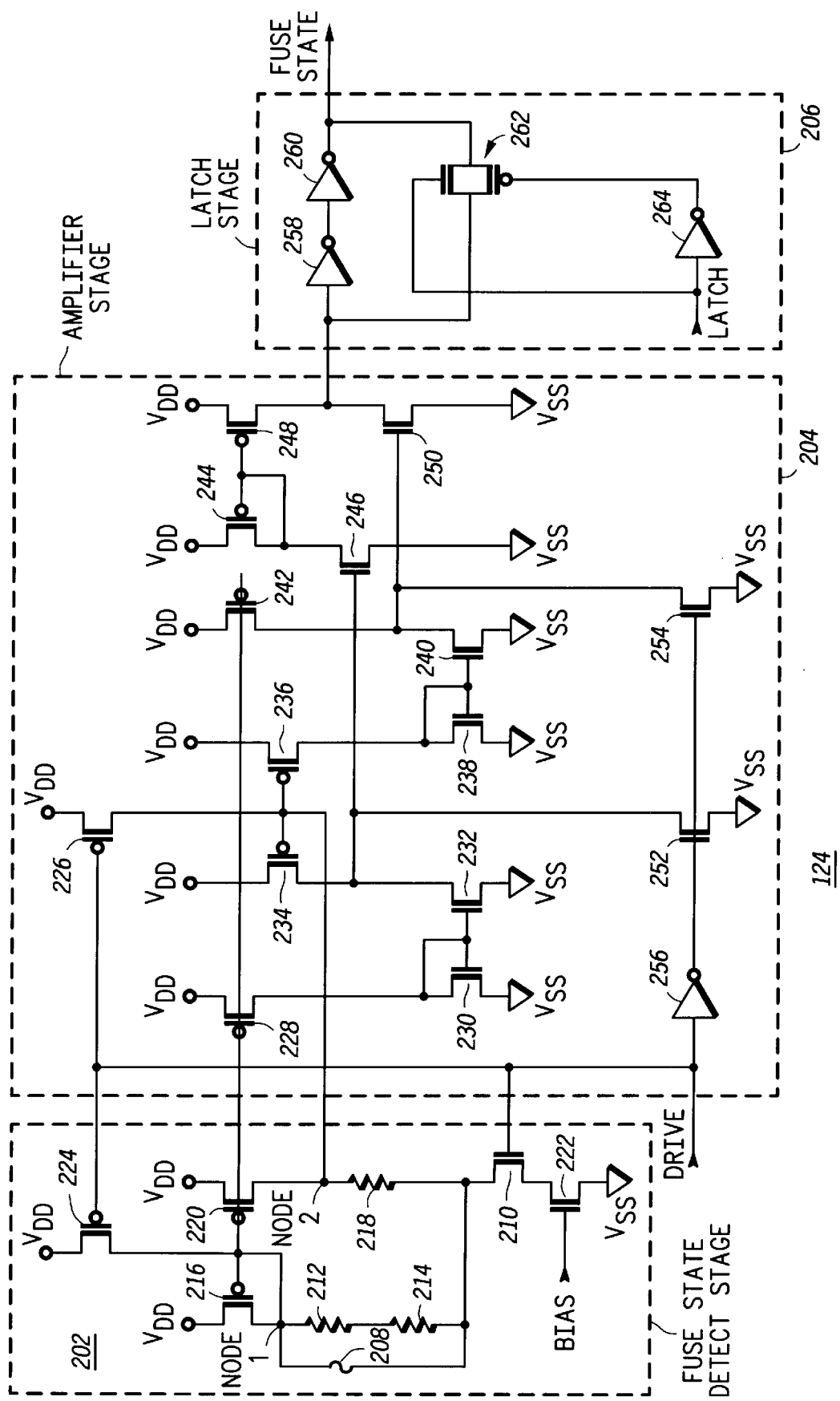
FIG. 2 depicts a circuit diagram of the fuses and detect circuits illustrated in FIG. 1.

FIG. 2 depicts a circuit diagram of the fuses and detect circuits 124 illustrated in FIG. 1. FIG. 2 depicts a single fuse and the corresponding detect circuit. One skilled in the art will readily appreciate that the circuit depicted in FIG. 2 is a single example of a redundancy fuse. Fuses and detect circuits 124 contain three stages for each fuse: a fuse state detect stage 202, an amplifier stage 204 and a latch stage 206. Generally, fuse state detect stage 202 senses whether a fuse 208 is blown (zero logic state) or is intact (one logic state) and generates a differential voltage level indicative of the fuse state. Amplifier stage 204 amplifies the differential voltage level to a full rail voltage potential. Latch stage 206 stores the state, enabling the first two stages to be disabled.

Continuing with fuse state detect stage 202, Node 1 and Node 2 output a differential voltage level based upon a current sunk through two circuit paths. The first circuit path contains a fuse in parallel with two series resistors. Fuse 208 is coupled between Node 1 and a first current electrode of an n-type metal oxide semiconductor field effect transistor (MOSFET) 210. Resistors 212 and 214 are connected in series between Node 1 and the first current electrode of transistor 210. Node 1 is coupled to a first current electrode of a p-type transistor 216. A second current electrode of transistor 216 is coupled to the voltage supply VDD. The second path within fuse state detect stage 202 contains a single resistor. Resistor 218 is connected to Node 2 and to the first current electrode of transistor 210. Node 2 is coupled to a first current electrode of a p-type transistor 220. A second current electrode of transistor 220 is coupled to the voltage supply VDD. Node 1 is also coupled to the control electrode of transistors 216 and 220. The control electrode and second current electrode of transistor 210 are coupled to the control signal DRIVE and to a first current electrode of an n-type transistor 222, respectively. A control electrode and second current electrode of transistor 222 are coupled to the bias voltage level BIAS and to a voltage supply VSS, respectively. The sum of the resistance of resistors 212 and 214 is greater that the resistance of resistor 218. In the depicted embodiment, the sum of the resistance of resistors 212 and 214 is twice that of resistor 218. Finally, a first current electrode, a control electrode, and a second current electrode of a p-type transistor 224 receives the voltage level VDD, receives the control signal DRIVE, and is coupled to Node 1, respectively.

Fuse state detect stage 202 is disabled when the control signal DRIVE is de-asserted. Specifically, transistor 210 is placed into a non-conductive state. Conversely, transistor 224 is placed into a conductive state. When transistor 224 is in a conducting state, transistors 216 and 220 are placed into a non-conducting state. When each of transistors 210, 216, and 220 is in a non-conductive state, no voltage potential develops across fuse 208, or resistors 212, 214, and 218. Fuse state detect stage 202 is enabled when the control signal DRIVE is asserted. Transistor 222 is biased with a specific voltage to sink a small current from Node 1 and Node 2. Because the control electrodes of transistors 216 and 220 are coupled, this sunk current is equally divided between the two nodes. The differential voltage generated by Node 1 and Node 2 will depend upon the relative resistance of the two circuit paths to transistor 222. The relative resistance of the two circuit paths, in turn, depends upon whether fuse 208 is blown or is intact. If fuse 208 is intact, then the resistance of the first path is approximately zero. The resistance of the second path remains constant. If fuse 208 is blown, then the resistance of the first path is the sum of the resistance of resistors 212 and 214. As described above, the sum of the resistance of resistors 212 and 214 is twice that of resistor 218. Therefore, the integrity of fuse 208 can be detected by the magnitude of the differential voltage. If fuse 208 is intact, then the voltage level at Node 1 will be less than the voltage level at Node 2. Conversely, if fuse 208 is blown, then the voltage level at Node 1 will be higher than the voltage level at Node 2.

Continuing with amplifier stage 204, a first current electrode and a control electrode of a p-type transistor 226 receives the voltage level VDD and is coupled to the control signal DRIVE. A first current electrode, a control electrode, and a second current electrode of a p-type transistor 228 are coupled to the voltage supply VDD, to Node 1, and to a first current electrode of an n-type transistor 230, respectively. A control electrode and a second current electrode of transistor 230 are coupled to the first current electrode thereof and to the voltage level VSS, respectively. A first current electrode, a control electrode, and a second current electrode of an n-type transistor 232 are coupled to the voltage supply VSS, to the control electrode of transistor 230, and to a first current electrode of a p-type transistor 234, respectively. A second current electrode of a transistor 234 is coupled to the voltage supply VDD. A control electrode of transistor 234 is coupled to a second current electrode of transistor 226, to a control electrode of a p-type transistor 236, and to Node 2. A first current electrode and a second current electrode of transistor 236 are coupled to the first voltage supply VDD and to a first current electrode of an n-type transistor 238, respectively. A control electrode and a second current electrode of transistor 238 are coupled to the first current electrode thereof and to the voltage level VSS, respectively. A first current electrode, a control electrode, and a second current electrode of an n-type transistor 240 are coupled to the voltage supply VSS, to the control electrode of transistor 238, and to a first current electrode of a p-type transistor 242, respectively. A second current electrode and a control electrode of transistor 242 are coupled to the voltage supply VDD and to Node 1, respectively.

A first current electrode and a second current electrode of a p-type transistor 244 are coupled to the voltage supply VDD and to a first current electrode of an n-type transistor 246, respectively. A control electrode of transistor 244 is coupled to the second current electrode thereof. A control electrode and a second current electrode of transistor 246 are coupled to second current electrode of transistor 232 and to the voltage supply VSS, respectively. A first current electrode, a control electrode, and a second current electrode of a p-type transistor 248 are coupled to the voltage supply VDD, to the control electrode of transistor 244, and to a first current electrode of an n-type transistor 250, respectively. A control electrode and a second current electrode of transistor 250 are coupled to second current electrode of transistor 240 and to the voltage supply VSS, respectively. The first current electrodes of each of n-type transistors 252 and 254 are coupled to the voltage supply VSS. The control electrodes of each of transistors 252 and 254 are coupled to an output of an inverter 256. An input of inverter 256 receives the control signal DRIVE. A second current electrode of transistor 252 is coupled to the second current electrode of transistor 232. A second current electrode of transistor 254 is coupled to the second current electrode of transistor 240.

Amplifier stage 204 is disabled when the control signal DRIVE is de-asserted. Specifically, transistors 252 and 254 place a low logic value on the control electrodes of transistors 246 and 250, respectively. The low logic value on the control electrode of transistor 246 forces a high logic level on the control electrode of transistor 248. Therefore, transistors 248 and 250 are both in a non-conductive or high impedance state. Amplifier stage 204 is enabled when the control signal DRIVE is asserted. As described above, when fuse 208 is intact Node 1<Node 2. Conversely, when fuse 208 is blown, Node 1>Node 2.

Fuse Intact, Node 1<Node 2 If the voltage level on Node 1 is less than the voltage level on Node 2, then transistor 228 will conduct more than will transistor 234. The current sourced by transistor 228 is mirrored by transistors 230 and 232. Transistor 232 will pull the control electrode of transistor 246 towards VSS, thereby placing it into a non-conductive state. When transistor 246 is in a non-conducting state it also places transistor 248 into a non-conducting state or high impedance. Simultaneously, transistor 242 will conduct more than will transistor 236. The current sourced by transistor 242 will pull the control electrode of transistor 250 towards VDD, thereby placing it into a conductive state. When transistor 246 is in a conducting state, it pulls the output of amplifier stage 204 to a low logic level.

Fuse Blown, Node 1>Node 2 If the voltage level on Node 2 is less than the voltage level on Node 1, then transistor 234 will conduct more than will transistor 228. The current sourced by transistor 234 will pull the control electrode of transistor 246 towards VDD, thereby placing it into a conductive state. When transistor 246 is in a conductive state, it pulls the control electrode of transistor 248 low. A low voltage level on the control electrode of transistor 248 places it into a conductive state. When transistor 248 is in a conductive state, it pulls the output of amplifier stage 204 to a high logic level. Simultaneously, transistor 236 will conduct more than will transistor 242. The current sourced by transistor 236 is mirrored by transistors 238 and 240. Transistor 240 will pull the control electrode of transistor 250 towards VSS, thereby placing it into a non-conductive or high impedance state.

Continuing with latch stage 206, an input of a first inverter 258 receives the output of amplifier stage 204. An output of inverter 258 is coupled to an input of a second inverter 260. An output of an inverter 260 generates the output of fuses and detect circuits 124, FUSE STATE. The output of inverter 260 is coupled to the input of inverter 258 via a pass gate 262. The n-type device in pass gate 262 receives the control signal LATCH. The p-type device in pass gate 262 is coupled to an output of a third inverter 264. An input of inverter 264 also receives the control signal LATCH.

When the control signal LATCH is de-asserted, pass gate 262 is non-conducting and latch stage 206 passes its input to its output. When the control signal LATCH is asserted, pass gate 262 is conducting, thereby coupling the output of latch stage 206 to its input.

Figure 3:
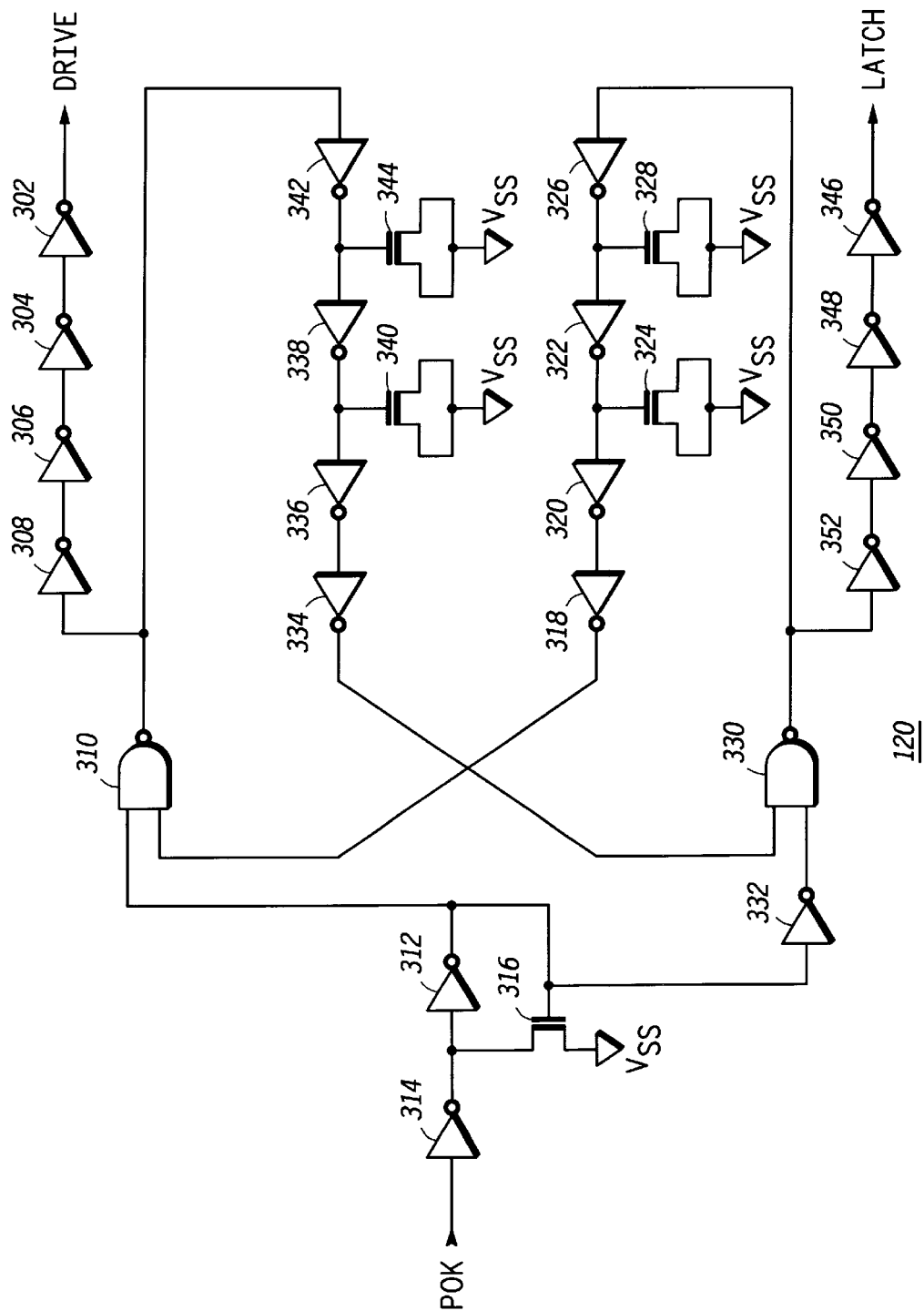
FIG. 3 depicts a circuit diagram of the fuse control circuit illustrated in FIG. 1.

FIG. 3 depicts a circuit diagram of the fuse control circuit 120 illustrated in FIG. 1. Fuse control circuit 120 includes inverters 302, 304, 306, 308, 312, 314,318, 320, 322, 326, 334, 336, 338, 342, 346, 348, 350, and 352, N-channel transistor 316, NAND logic gates 310 and 330, and capacitors 324, 328, 340, and 344. Fuse control circuit 120 receives a power up clear signal labeled "POK" at an input terminal of inverter 314. N-channel transistor 316 and inverter 312 form a buffer with a certain amount of hysteresis. This hysteresis tends to regularize the response of fuse control 120 in the event that the external power supply rises irregularly. Otherwise, this irregular power supply behavior could cause multiple transitions on POK. The output of inverter 312 is provided to input terminals of inverter 332 and NAND logic gate 310. The series-connected inverters 352, 350, 348, and 346 provide a buffered control signal labeled "LATCH" which is routed to control the latches 206 of all of the fuses and detect circuits 124. Likewise, the series-connected inverters 308, 306, 304, and 302 provide a buffered control signal labeled "DRIVE" to all of the fuses and detect circuits 124. The series-connected inverters 326, 322, 320, and 318 along with capacitors 328 and 324 receive the output of NAND gate 330, add a predetermined delay to that output, and couple the resulting delayed signal to an input of NAND gate 310. The output of inverter 318 is coupled to an input of NAND logic gate 310. The series-connected inverters 342, 338, 336, and 334 along with capacitors 344 and 340 receive the output of NAND gate 310, add a predetermined delay to that output, and couple the resulting delayed signal to an input of NAND gate 330.

During power up of integrated circuit memory 100, the supply voltage is below a valid level, causing the power up clear signal POK to go to a logic low. The output of inverter 312 will also be a logic low, causing NAND gate 310 to provide a logic high voltage to inverters 308, 306, 304, and 302. Inverter 302 generates a logic high on control signal DRIVE. A logic high DRIVE signal then enables fuse state detect stage 202 and sense amplifier stage 204 to detect and amplify an output signal corresponding to the state of fuse 208. The output of NAND logic gate 310 will propagate through series-connected inverters 342, 338, 336 and 334, causing inverter 334 to provide a logic high to an input of NAND logic gate 330. Logic high levels from both inverter 334 and 332 are then present at NAND gate 330, causing it to generate a logic low. This logic low level is provided to inverters 352, 350, 348, and 346. Inverter 346 generates a logic low on control signal LATCH. The logic low control signal LATCH prevents latch stage 206 from latching the output of sense amplifier stage 204. The logic low from NAND logic gate 330 will also propagate through inverters 326, 322, 320 and 318 and cause a logic low to be provided to the input of NAND logic gate 310 after a delay determined by the capacitance of capacitors 328 and 324.

When power up clear signal POK becomes a logic high value, indicating that the power supply voltage is sufficient to allow reliable operation of integrated circuit memory 100, then the output of inverter 312 becomes a logic high. NAND logic gate 330 receives a logic low from inverter 332, causing the output of NAND logic gate 330 to change to a logic high voltage, resulting in control signal LATCH becoming a logic high. A logic high LATCH signal causes the output signal from amplifier stage 204 to be latched in latch stage 206. After a delay determined by inverters 326, 322, 320, and 318, and capacitors 328 and 324, a logic high voltage is provided to the input of NAND logic gate 310, causing the output of NAND logic gate 310 to change to a logic low. The logic low is provided to the input of inverter 308, causing control signal DRIVE to become a logic low. When low, the control signal DRIVE disables amplifier stage 204 and fuse state detect stage 202, thus reducing power consumption of integrated circuit memory 100. Inverters 326, 322, 320, and 318 along with capacitors 328 and 324 ensure that the output of amplifier stage 204 is latched before disabling amplifier stage 204 and fuse state detect stage 202. The logic states of control signals LATCH and DRIVE will remain a logic high and a logic low, respectively, until signal POK becomes a logic low.

Although the present invention has been described with reference to a specific embodiment, further modifications and improvements will occur to those skilled in the art. For example, the disclosed memory may be incorporated into another device such as a data processor or digital signal processor. Also, the disclosed fuse and detection circuit may be incorporated into a device separate from the memory array. In such an application, the fuse and detection circuit would contain data other than faulty row and column information. For instance, a bank of fuses could identify a serial number, batch processing number, or revision number of an integrated circuit. Furthermore, many of the specific circuits embodiments depicted may be modified by one skilled in the art, in combination with the present teaching, to perform the same function. Therefore, it is intended that this invention encompass all such variations and modifications as fall within the scope of the appended claims.

What is claimed is:

1. A fuse detect circuit, comprising:
    a fuse state detect stage for providing an output signal of a first logic state in response to detecting a fuse is an open circuit, and for providing the output signal of a second logic state in response to detecting the fuse is a short circuit, wherein the fuse state detect stage limits a voltage drop across the fuse to an absolute value independent of a power supply voltage value applied to the fuse detect circuit; and
    a latch stage, coupled to the fuse state detect stage, for latching a logic state of the output signal.

2. The fuse detect circuit of claim 1, wherein the fuse state detect stage detects the fuse is an open circuit or a short circuit during a power up sequence of an integrated circuit including the fuse detect circuit.

3. The fuse detect circuit of claim 2, wherein the fuse state detect stage is disabled after detecting that the fuse is an open circuit or a short circuit.

4. The fuse detect circuit of claim 3, wherein the fuse state detect stage is disabled in response to receiving a control signal indicating that the power supply voltage value is sufficient for reliable operation of the integrated circuit.

5. The fuse detect circuit of claim 4, wherein the logic state of the output signal is latched before the fuse state detect stage is disabled.

6. The fuse detect circuit of claim 1, wherein the fuse comprises copper.

7. The fuse state detect circuit of claim 1, wherein the fuse detect stage comprises:
    a first transistor having a first current electrode coupled to a first power supply voltage terminal, a second current electrode, and a control electrode coupled to the second current electrode of the first transistor;
    a second transistor having a first current electrode coupled to the first power supply voltage terminal, a second current electrode, and a control electrode coupled to the control electrode of the first transistor,
    a first resistor having a first terminal coupled to the second current electrode of the first transistor, and a second terminal, the first resistor having first resistance value;
    the fuse having a first terminal coupled to the first terminal of the first resistor and a second terminal coupled to the second terminal of the first resistor;
    a second resistor having a first terminal coupled to the second current electrode of the second transistor, and a second terminal, the second resistor having a second resistance value different from the first resistance value; and
    a third transistor having a first current electrode coupled to the second terminals of both of the first and second resistors, a control electrode for receiving a bias voltage, and a second current electrode coupled to a second power supply voltage terminal.

8. The fuse detect circuit claim 7, wherein the first resistance value is larger than the second resistance value.

9. The fuse detect circuit of claim 1, wherein the fuse detect circuit is one of a plurality of fuse detect currents used to store redundant element repair information in an integrated circuit memory.

10. An integrated circuit memory, comprising:
    a plurality of memory cells;
    a plurality of redundant memory cells;
    address decoding circuits, coupled to the plurality of memory cells and to the plurality of redundant memory cells, for selecting a memory cell in response to receiving an address; and
    a plurality of fuse detect circuits, coupled to the plurality of memory cells and to the plurality of redundant memory cells, for identifying a defective memory cell, and for identifying which of the plurality of redundant memory cells replaces the defective memory cell, a fuse detect circuit of the plurality of fuse detect circuits comprising:
        a fuse having an open circuit state and a short circuit state; and
        a circuit for detecting the open circuit state or the short circuit state of the fuse, and for providing a corresponding output signal, wherein during the detecting, the circuit limits a voltage drop across the fuse to an absolute value independent of a power supply voltage value applied to the integrated circuit memory.

11. The integrated circuit memory of claim 10, wherein the circuit detects a state of the fuse during a power up sequence of the integrated circuit memory.

12. The integrated circuit memory of claim 10, wherein the circuit is disabled in response to receiving a control signal indicating that the power supply voltage value is sufficient for reliable operation of the integrated circuit memory.

13. The integrated circuit memory of claim 10, further comprising an amplifier stage, coupled to the circuit, for amplifying the output signal to produce an amplified output signal.

14. The integrated circuit memory of claim 13, further comprising a latch, coupled to the circuit, for latching a state of the amplified output signal.

15. The integrated circuit memory of claim 14, further comprising a control circuit, coupled to the circuit, for disabling the amplifier stage a predetermined time after the state of the amplified output signal is latched.

16. The integrated circuit memory of claim 10, wherein the fuse comprises copper.

17. The integrated circuit memory of claim 10, wherein the circuit comprises:

a first transistor having a first current electrode coupled to a first power supply voltage terminal, a second current electrode, and a control electrode coupled to the second current electrode of the first transistor;

a second transistor having a first current electrode coupled to the first power supply voltage terminal, a second current electrode, and a control electrode coupled to the control electrode of the first transistor, a first resistor having a first terminal coupled to the second current electrode of the first transistor, and a second terminal, the first resistor having first resistance value;

the fuse having a first terminal coupled to the first terminal of the first resistor and a second terminal coupled to the second terminal of the first resistor;

a second resistor having a first terminal coupled to the second current electrode of the second transistor, and a second terminal, the second resistor having a second resistance value different from the first resistance value; and a third transistor having a first current electrode coupled to the second terminals of both of the first and second resistors, a control electrode for receiving a bias voltage, and a second current electrode coupled to a second power supply voltage terminal.

18. The integrated circuit memory of claim 17, wherein the first resistance value is larger than the second resistance value.

19. In an integrated circuit memory, a method for implementing a fuse comprising the steps of:

providing a fuse comprising copper, wherein the fuse, if intact, provides a first logic state and the fuse, if blown, provides a second logic state;

detecting if the fuse is blown or intact using a fuse detect circuit;

limiting a voltage drop across the fuse when the fuse is blown to an absolute value independent of a power supply voltage applied to the integrated circuit memory;

storing a logic state of the fuse; and disabling the fuse detect circuit in response to the power supply voltage being sufficient for reliable operation of the integrated circuit memory.

20. The method of claim 19, wherein the step of detecting occurs during a power up sequence of the integrated circuit memory.

* * * * *

UNITED STATES PATENT AND TRADEMARK OFFICE
CERTIFICATE OF CORRECTION

PATENT NO.   : 6,157,583
DATED        : December 5, 2000
INVENTOR(S)  : Glen E. Starnes et al.

It is certified that error appears in the above-identified patent and that said Letters Patent is hereby corrected as shown below:

Column 8,
Line 42, change "currents" to -- circuits --

Signed and Sealed this

Eleventh Day of February, 2003

JAMES E. ROGAN
*Director of the United States Patent and Trademark Office*